US012811602B2

(12) United States Patent
Lam et al.

(10) Patent No.: US 12,811,602 B2
(45) Date of Patent: Nov. 24, 2026

(54) HIGH-SPEED DIGITAL TO ANALOG CONVERTER WITH HIGH-SPEED INTERLEAVER AND MISALIGNMENT DETECTOR

(71) Applicant: Ciena Corporation, Hanover, MD (US)

(72) Inventors: Jerry Yee-Tung Lam, Markham (CA); Douglas Stuart McPherson, Ottawa (CA); Yuriy Greshishchev, Ottawa (CA)

(73) Assignee: Ciena Corporation, Hanover, MD (US)

( * ) Notice: Subject to any disclaimer, the term of this patent is extended or adjusted under 35 U.S.C. 154(b) by 112 days.

(21) Appl. No.: 18/934,558

(22) Filed: Nov. 1, 2024

(65) Prior Publication Data

US 2026/0128748 A1 May 7, 2026

(51) Int. Cl.
*H03M 1/66* (2006.01)
*H04B 3/02* (2006.01)

(52) U.S. Cl.
CPC .............. *H03M 1/662* (2013.01); *H04B 3/02* (2013.01)

(58) Field of Classification Search
CPC ........ H03M 1/662; H03M 1/742; H03M 1/66; H03M 1/0624; H03M 1/0836; H03M 1/0678; H03M 1/0863; H03M 1/1215; H03M 1/74; H03M 1/747; H03M 1/76; H03M 1/00; H03M 1/0673; H03M 1/0845; H03M 1/1057; H03M 1/665; H03M 1/745; H03M 1/82; H03M 3/464; H03M 1/005; H03M 1/06; H03M 1/0607; H03M 1/0614; H03M 1/0626; H03M 1/0631; H03M 1/0646; H03M 1/0658; H03M 1/066; H03M 1/0665; H03M 1/068; H03M 1/0697;
(Continued)

(56) References Cited

U.S. PATENT DOCUMENTS 7,679,538 B2 * 3/2010 Tsang .................. H03M 1/0678 341/145
8,773,296 B1 * 7/2014 Dusatko .................. H03M 3/50 341/143

(Continued)

*Primary Examiner* — Linh V Nguyen
(74) *Attorney, Agent, or Firm* — Young Basile Hanlon & MacFarlane, P.C.

(57) ABSTRACT

Described is a high-speed digital-to-analog converter (DAC) with an interleaver and misalignment detector. The interleaver has a first pair of differential pair ports to receive a first data stream from a first sub-DAC and a second pair of differential pair ports to receive a second data stream from a second sub-DAC. Each of the first and second pair of differential pair ports are alternately selected or alternately selected identically clocked by a differential sampling frequency ($F_S$)/2 ($F_S$/2) frequency clock to generate output signals. A set of transmission wires combine certain output signals from the first pair of differential pair ports with certain output signals from the second pair of differential pair ports to generate a device output signal. A first transmission wire and a second transmission wire have a defined degree of crossover to reduce differential $F_S$/2 frequency clock feedthrough with minimal change on a device output signal.

20 Claims, 8 Drawing Sheets

(58) Field of Classification Search

CPC .... H03M 1/0827; H03M 1/0872; H03M 1/10; H03M 1/1033; H03M 1/12; H03M 1/1225; H03M 1/1245; H03M 1/127; H03M 1/54; H03M 1/68; H03M 1/765; H03M 1/785; H03M 1/80; H03M 1/808; H03M 13/15; H03M 13/1515; H03M 13/152; H03M 13/2732; H03M 13/29; H03M 13/2924; H03M 3/32; H03M 3/50; H03M 3/502; H03M 3/51; H03M 7/3042

USPC .......................... 341/118–120, 141, 142, 144

See application file for complete search history.

(56) References Cited

U.S. PATENT DOCUMENTS

| | | | | |
|---|---|---|---|---|
| 9,197,241 | B2 * | 11/2015 | Liu | H03M 1/66 |
| 9,385,742 | B1 * | 7/2016 | Cheng | H03M 1/742 |
| 9,413,394 | B1 * | 8/2016 | Lye | H04B 1/0014 |
| 9,584,151 | B1 * | 2/2017 | Manganaro | H03M 1/0863 |
| 9,966,969 | B1 * | 5/2018 | Engel | H03M 1/662 |
| 10,727,854 | B1 * | 7/2020 | Greshishchev | H03M 1/1215 |
| 2021/0021279 | A1 * | 1/2021 | Tseng | H03M 1/74 |
| 2021/0126644 | A1 * | 4/2021 | Sharma | H03M 1/0836 |
| 2022/0239304 | A1 * | 7/2022 | Gunasekaran | H03M 1/1033 |
| 2024/0204795 | A1 * | 6/2024 | Swaminathan | H03M 1/005 |
| 2025/0253861 | A1 * | 8/2025 | Xin | H03M 1/662 |

* cited by examiner

HIGH-SPEED DIGITAL TO ANALOG CONVERTER WITH HIGH-SPEED INTERLEAVER AND MISALIGNMENT DETECTOR

TECHNICAL FIELD

This disclosure relates to digital to analog converter (DAC) circuits.

BACKGROUND

The need for high-speed and high-performance DACs in optical transceivers grows as the data rate in optical coherent modems increases. High-speed and high-performance DACs require multiple high speed multiplexing stages to convert a wide bus of parallel input data into a single high speed analog signal. However, the capacity of semiconductor technologies optimized for high-speed digital signal processing and data processing is lacking in terms of speed of operation, precision in timing, output linearity, and frequency response. Moreover, even if the technology is capable, the circuitry can be complex, occupy a larger portion of area, and have high power consumption.

SUMMARY

Described herein are apparatus and methods for digital to analog converter (DAC) circuits.

In an implementation, a device includes an interleaver with a first pair of differential pair ports configured to receive a first data stream or analog signal from a first sub-digital-to-analog converter (sub-DAC) and a second pair of differential pair ports configured to receive a second data stream or analog signal from a second sub-DAC. Each of the first pair of differential pair ports and each of the second pair of differential pair ports are alternately selected and/or alternately selected identically by a differential sampling frequency ($F_S$)/2 ($F_S/2$) frequency clock to generate output signals. A set of transmission wires are configured to combine certain output signals from the first pair of differential pair ports with certain output signals from the second pair of differential pair ports to generate a device output signal. A pair of transmission wires are configured to output the device output signal. A first transmission wire and a second transmission wire of the pair of transmission wires have a defined degree of crossover to reduce differential $F_S/2$ frequency clock feedthrough on the device output signal with minimal change to the device output signal.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
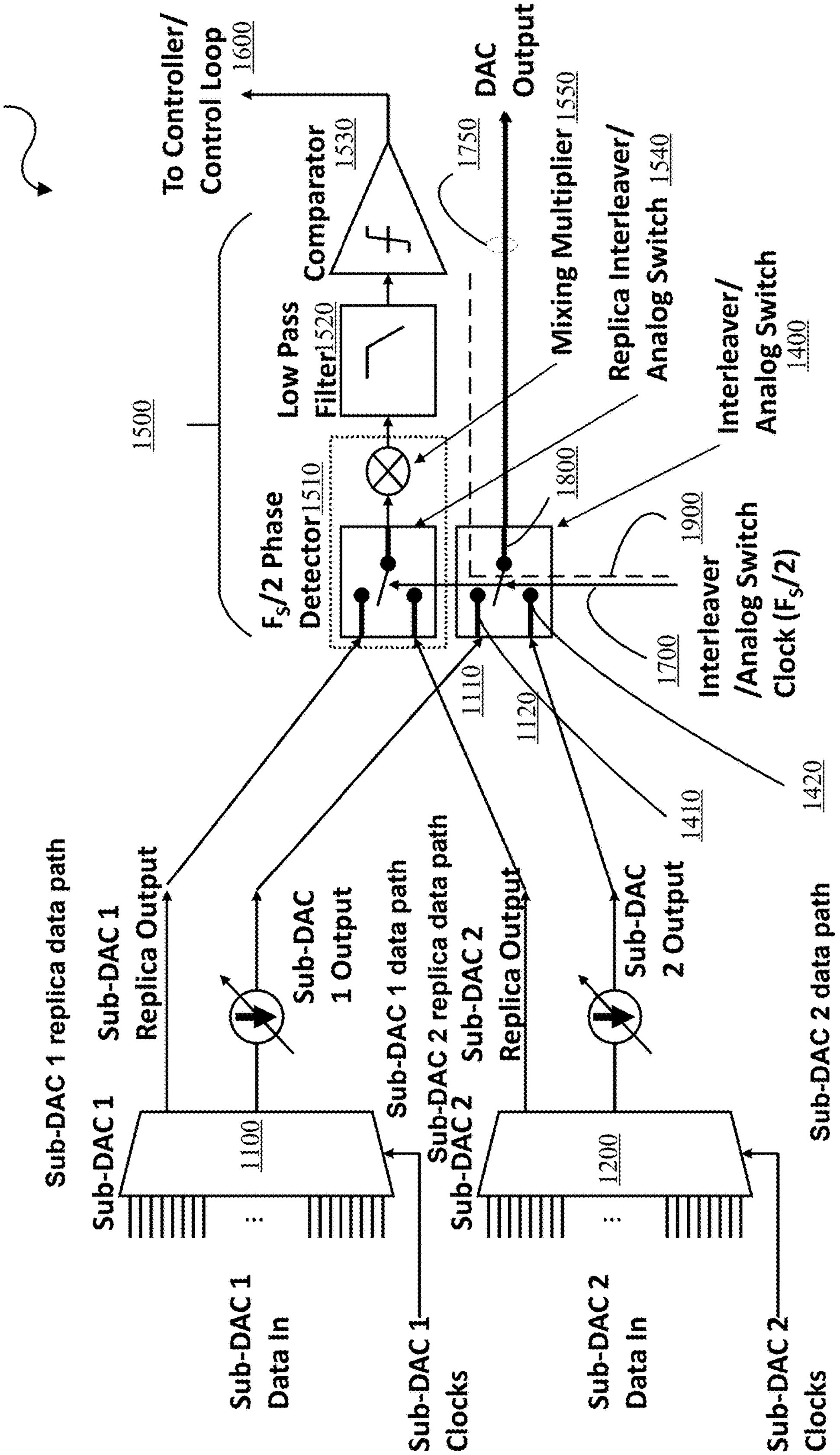
FIG. 1 is a block diagram of an example of a digital to analog converter (DAC) in accordance with embodiments of this disclosure.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU) s, one or more graphics processing units (GPU) s, one or more digital signal processors (DSP) s, one or more application specific integrated circuits (ASIC) s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks, or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, and/or manufactures, while eliminating for the purpose of clarity other aspects that may be found in typical similar devices, systems, and methods. Those of ordinary skill may thus recognize that other elements and/or steps may be desirable or necessary to implement the devices, systems, and methods described herein. However, because such elements and steps do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Coherent optical communications links and technologies operating at high baud rates need DACs capable of operating at a sampling frequency or rate ($F_S$), for example, of over 200 GS/s rate. These high-speed and high-performance DACs require multiple high speed multiplexing stages to convert a wide bus of parallel input data into a single high speed analog signal. In implementations, for very high sample rates above 100 GS/s, a final multiplexing stage can be done at the analog charge domain with an interleaver (an analog signal device), analog multiplexer, or analog switch (collectively "interleaver"). Due to its high speed and its function as the final multiplexing stage operating in the analog domain, the interleaver has high performance requirements in terms of speed of operation, precision in timing, and both output linearity and frequency response. In addition, the high performance DAC for optical applications requires low output clock feedthrough to improve signal integrity. Moreover, the high performance DAC for optical applications needs to avoid or mitigate adjacent channel interference.

To operate the interleaver at a $F_S$ of over 200 GS/s rate, for example, the interleaver clock ($F_S/2$) and data inputs (running or operating at a $F_S/4$ frequency clock) need to be precisely aligned. This precise alignment must be maintained in view of the fact that the interleaver clock and the data input clocks originate from different sources. For example, the interleaver clock may originate from a clock generation circuit and the data input clocks may originate from relatively distantly located sub-DACs. The time delays need to be kept very precise (e.g., with a magnitude less than 0.5 ps) across many different operational stresses-temperature changes, voltage droops, aging effective, noise, interference, or combinations thereof.

In implementations, alignment can be maintained using a misalignment detector or a phase detector (collectively "misalignment detector"). The misalignment detector needs to work with very high speed signals, have good delay matching characteristics, and operate at very high speeds. The misalignment detector can create an output DC level signal that corresponds to the phase relationship of the interleaver clock ($F_S/2$) and the data eyes of the two data streams (operating at the $F_S/4$ frequency clock) coming from the sub-DACs. In implementations, replica data generators (from or part of the sub-DACs) can be used to generate replica patterned data streams (i.e., a replica data streams operating at the $F_S/4$ frequency clock) with the same phase as the data eyes of the two data streams (operating at the $F_S/4$ frequency clock) coming from the sub-DACs. That is, the replica data generators or replica sub-DACs can output $F_S/4$ clocks which have rising and fall edges that are parametrically aligned with those of the analog data transitions in the sub-DAC outputs.

In implementations, the interleaver can include two (2) or a pair of differential pair ports for receiving data streams (operating at the $F_S/4$ frequency clock), which are alternately selected and/or alternately selected identically by the $F_S/2$ frequency clock. To be clear, the 2 data streams or differential signals are carried on four (4) wires. The outputs of the differential pair ports are combined together differentially via output transmission lines designed with a crossover designed to reject the $F_S/2$ frequency clock at or near a defined clock frequency. In implementations, the defined clock frequency is substantially at or near 100 GHz. This suppresses additional mixed mode coupling above 100 GHz. For example, mixed mode coupling can refer to odd mode coupling, even mode coupling, differential mode coupling, common mode coupling, and/or appropriate combinations thereof. This is important because below 100 GHz (the bandwidth of the DAC) the output transmission lines pass the output data signal while above 100 GHz is output clock feedthrough (the $F_S/2$ frequency clock) and mixing products with the feedthrough clock. By increasing the coupling for the above 100 GHz portion, the output clock feedthrough is greatly reduced, while the data path remains unchanged or is minimally unaffected. In addition, the layout of the interleaver places or positions the output transmission lines in a non-overlapping or substantially non-overlapping relationship with respect to the interleaver or $F_S/2$ frequency clock. This also minimizes the output clock feedthrough of the interleaver or $F_S/2$ frequency clock at the DAC output.

As noted, in implementations, the DAC can include a misalignment detector that detects the alignment of the interleaver clock ($F_S/2$) phase relative to the two replica DAC paths (e.g., the two replica data streams operating at the $F_S/4$ frequency clock). In implementations, the misalignment detector can include two (2) or a pair of differential pair ports (a replica interleaver) co-located with the interleaver differential pair ports. This can ensure that the input clock phases going to the misalignment detector or the replica interleaver match in both amplitude and phase with the input clock phases going to the interleaver. This also reduces the $F_S/2$ (e.g., over 100 GHz) clock wire length (to avoid adding additional phase shift between the interleaver and misalignment detector $F_S/2$ clock) and the necessary area required in the DAC for the interleaver and the misalignment detector or the replica interleaver. This also prevents the effect of signal reflections at the input of the misalignment detector or the replica interleaver for both the clock and replica data paths, which is important in maintaining signal integrity, signal level, and matching its corresponding clock phase.

In implementations, a multiplexor-type functionality of the misalignment detector aligns or maintains the interleaver or $F_S/2$ frequency clock substantially centered around the peaks and troughs of the replica data streams (or alternatively away from sub-DAC output sample transitions). The misalignment detector uses the outputs of the pair of differential pair ports of the replica interleaver to generate replica select and output signals. One of the pair of differential pairs mixes a $F_S/4$ replica data stream with the $F_S/2$ frequency clock to produce $F_S/2$ current pulses and $F_S/4$ voltage select signals. In implementations, resistors can be used as current-to-voltage converters. The resistors at the replica outputs can reduce phase shift due to lower capacitance. In implementations, diode connected transistors can be used as the current-to-voltage converters. The other of pair of differential pairs are controlled by the voltage select signals to mask half of the $F_S/2$ current pulses. A phase detector output is the half set of current pulses where the relative magnitude of the sum of the P pulses to the N pulses is proportional to the phase delay of the $F_S/2$ clock with respect to the $F_S/4$ replica data. This holds true in the neighborhood of $F_S/2$ delayed from $F_S/4$ by 1 unit interval.

The replica select and output signals can be combined and summed to create an output DC level proportional to the phase shift to indicate the presence, direction, and magnitude of any phase misalignment. When the interleaver clock and replica data streams are correctly aligned, each select signal substantially matches in timing to a corresponding output signal on the other side of the replica interleaver. If there is a misalignment, four (4) of the sets of select/output signals will become smaller, and four (4) become larger. By taking the sum of each of the four (4) sets together and comparing them to each other, the presence, direction, and magnitude of the clock/data misalignment can be detected.

In implementations, the misalignment detector combining and summation operations are done by a circuit placed at the center of the replica interleaver. The outputs of the misalignment detector differential pair ports meet in the middle. The misalignment detector combining and summation circuit and the output transmission line of the interleaver are shielded from one another. A ground plane is used to isolate the circuit and the output transmission line.

In implementations, the misalignment detector samples the replica data signals directly by the $F_S/2$ clock, at nearly identical locations as the interleaver differential pairs. This minimizes the additional $F_S/2$ loading and clock lines, and the resultant sampling of the replica data signals occurs at a nearly identical time as the data signals from the sub-DACs, improving the correlation with the misalignment detector. The large $F_S/2$ clock signal means that the switching of the replica current paths is strong.

Described herein is a high-speed DAC with an interleaver, output $F_S/2$ clock tone suppression, and integrated misalignment detector.

FIG. 1 is a block diagram of an example of a DAC 1000 in accordance with embodiments of this disclosure. The DAC 1000 includes a sub-DAC 1 1100 for processing sub-DAC 1 data in using a sub-DAC 1 clock to generate a sub-DAC 1 output, where the sub-DAC 1 clock is a differential $F_S/4$ frequency clock, and a sub-DAC 2 1200 for processing sub-DAC 2 data in using a sub-DAC 2 clock to generate a sub-DAC 2 output, where the sub-DAC 2 clock is a differential $F_S/4$ frequency clock. The sub-DAC 1 1100 can also generate a sub-DAC 1 replica output using the sub-DAC 1 clock, where the sub-DAC 1 replica output is a patterned output such as a square wave output. Similarly, the sub-DAC 2 1200 can also generate a sub-DAC 2 replica output using the sub-DAC 2 clock, where the sub-DAC 2 replica output is a patterned output such as a square wave output. With a sampling rate of 1/fs, the interleaved DAC system necessitates clocking the two sub-DACs at one unit interval apart. As the two sub-DACs are clocked at $F_S/4$, this leads to a quadrature relationship between the two $F_S/4$ clocks, e.g., the sub-DAC 1 clock and the sub-DAC 2 clock.

The sub-DAC 1 output, the sub-DAC 2 output, the sub-DAC 1 replica output, and the sub-DAC 2 replica output each include positive (P) and negative (N) polarity signals, each pair of P and N signals constituting a differential signal. Referring now also to the remaining figures, the sub-DAC 1 output (based on sub-DAC 1 data in) is a differential signal including an AN single ended signal and an AP single ended signal. The sub-DAC 2 output (based on sub-DAC 2 data in) is a differential signal including an BN single ended signal and an BP single ended signal. The replica sub-DAC 1 output is (ideally) a square wave pattern generated using a sub-DAC 1 current source and the sub-DAC 1 $F_S/4$ clock. The replica sub-DAC 1 output is a replica differential signal including a replica AN single ended signal and a replica AP single ended signal. The replica sub-DAC 2 output is a square wave pattern generated using a sub-DAC 2 current source and the sub-DAC 2 $F_S/4$ clock. The replica sub-DAC 2 output is a replica differential signal including a replica BN single ended signal and a replica BP single ended signal.

The sub-DAC 1 1100 is connected to, coupled with, or in communication with (collectively "connected to") an interleaver or analog switch (collectively "interleaver") 1400 and a misalignment detector circuit 1500. The misalignment detector circuit 1500 can include a misalignment detector or phase detector (collectively "misalignment detector") 1510, which is connected to a low pass filter 1520. The low pass filter 1520 is connected to a controller 1600 or processed in a control loop (collectively "controller 1600"). In implementations, the low pass filter 1520 is connected to a comparator 1530, which in turn is connected to the controller 1600. The misalignment detector 1510 can include a replica interleaver 1540 connected to a mixing multiplier 1550.

The interleaver 1400 can process the sub-DAC 1 output and the sub-DAC 2 output using an interleaver or analog switch clock (collectively "interleaver clock") sent over clock wires 1700 to generate and send a DAC output over transmission wires 1750, where the interleaver clock is a differential $F_S/2$ frequency clock. In implementations, the interleaver 1400 can include a first pair of differential pair ports 1410 and a second pair of differential pair ports 1420 (e.g., four (4) differential pair ports) which are substantially identically clocked with the interleaver clock and/or alternately selected identically and/or alternately selected by the interleaver clock. A set of transmission wires 1800 can combine certain output signals of the sub-DAC 1 output (e.g., single ended polarity signals of a differential signal output from sub-DAC 1) and the sub-DAC 2 output (e.g., single ended polarity signals of a differential signal output from sub-DAC 2) to generate the DAC output. In implementations, the clock wires 1700 and the transmission wires 1750 are in a non-overlapping and/or substantially non-overlapping configuration.

The misalignment detector circuit 1500 can process the sub-DAC 1 replica output and the sub-DAC 2 replica output using the interleaver clock to determine whether there is alignment between sub-DAC data paths, e.g., a sub-DAC 1 data path and a sub-DAC 2 data path, and the interleaver clock. The misalignment detector 1510 and the low pass filter 1520 can generate an output DC level signal (an "alignment signal") that corresponds to a phase relationship of the interleaver clock, and the data eyes of the two replica sub-DAC data streams coming from the sub-DACs, i.e., sub-DAC 1 1100 and sub-DAC 2 1200 (which is equivalent terminology to the sub-DAC replica data paths). In implementations, the comparator 1530 can process the output DC level signal and generate an early-late signal (which can be digital signal) as described herein. In implementations using the comparator 1530, the term alignment signal can refer to the early-late signal, as appropriate. The controller 1600 can adjust the sub-DAC 1 clock and the sub-DAC 2 clock in view of the alignment signal (which can be the output DC level signal or the early-late signal, as appropriate) to align the interleaver clock with the data eyes of the two sub-DAC replica data streams. In implementations, time averaging by a subsequent accumulator (for example in the controller/control loop 1600) then periodically adjusts the phase of the Fs/4 clocks (e.g., the sub-DAC 1 clock and the sub-DAC 2 clock) with respect to the Fs/2 clock.

In implementations, the DAC 1000 can include shielding 1900 to isolate the interleaver clock and/or clock wires 1700 from the set of transmission wires 1800, the transmission wires 1750, and data input lines 1110 and 1120 to the interleaver 1400.

Figure 2:
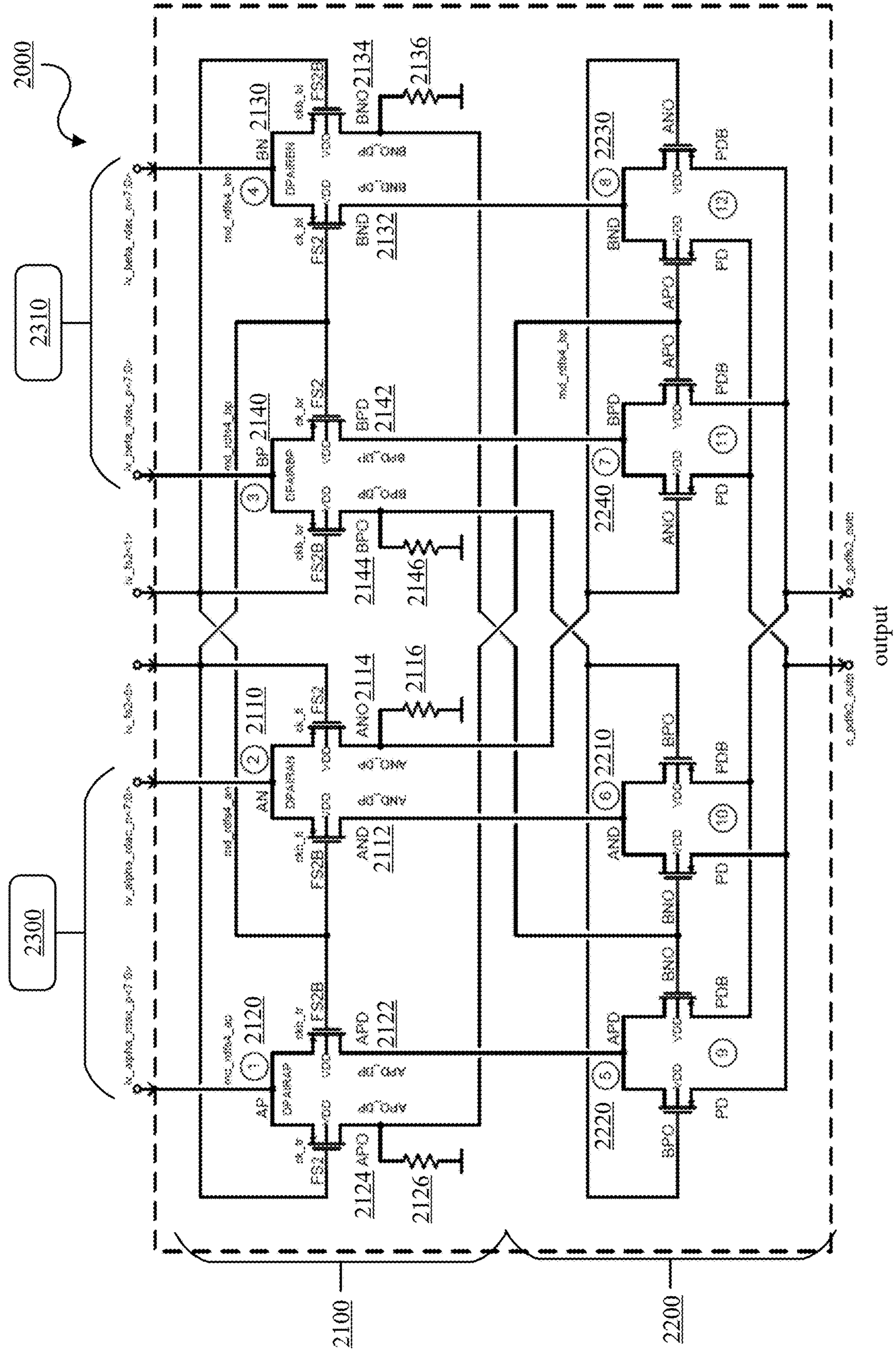
FIG. 2 is a block diagram of a misalignment detector in accordance with embodiments of this disclosure.

FIG. 2 is a block diagram of a misalignment detector 2000 in accordance with embodiments of this disclosure. The misalignment detector 2000 can be the misalignment detector 1510 of FIG. 1. In implementations, the misalignment detector 2000 can include a replica interleaver 2100 connected to a multiplexor circuit 2200. The replica interleaver 2100 can include differential pair ports 2110, 2120, 2130, and 2140. The differential pair ports 2110 and 2120 are connected to an AN single ended signal and an AP single ended signal, respectively, that are generated from a sub-DAC 1 current source 2300 (in a sub-DAC 1) sampled using a sub-DAC 1 differential clock. The differential pair ports 2130 and 2140 are connected to an BN single ended signal and an BP single ended signal, respectively, that are generated from a sub-DAC 2 current source 2310 (in a sub-DAC 2) sampled using a sub-DAC 2 differential clock. Each of the differential pair ports 2110, 2120, 2130, and 2140 is connected to a select port 2112, 2122, 2132, and 2142, and an output port 2114, 2124, 2134, and 2144, respectively, to generate and output replica select and output signals, AND, APD, BND, BPD, ANO, APO, BNO, and BPO, respectively, via alternate selection by a differential sampling frequency $(F_S)/2$ $(F_S/2)$ frequency clock. Each of the output ports 2114, 2124, 2134, and 2144 are connected to current to voltage converters 2116, 2126, 2136, and 2146, each of which converts a respective current to a voltage that drives the respective differential pair that steers the other current in the multiplexor circuit 2200. In particular, the multiplexor circuit 2200 can include differential pair ports 2210, 2220, 2230, and 2240. The differential pair ports 2210, 2220, 2230, and 2240 are each connected to a select port 2112, 2122, 2132, and 2142, respectively. With respect to differential pair ports 2210, a selection signal received from select port 2112 selects between output signals received from output port 2134 and output port 2144 to generate its output signal. With respect to differential pair ports 2220, a selection signal received from select port 2122 selects between output signals received from output port 2144 and output port 2134 to generate its output signal. With respect to differential pair ports 2230, a selection signal received from select port 2132 selects between output signals received from output port 2124 and output port 2114 to generate its output signal. With respect to differential pair ports 2240, a selection signal received from select port 2142 selects between output signals received from output port 2114 and output port 2124 to generate its output signal. The respective output signals from the differential pair ports 2210, 2220, 2230, and 2240 are combined to generate the misalignment detector output or alignment signal. Although the current to voltage converters 2116, 2126, 2136, and 2146 are connected to the output ports 2114, 2124, 2134, and 2144, respectively, the current to voltage converters 2116, 2126, 2136, and 2146 can be connected to the select ports 2112, 2122, 2132, and 2142 with appropriate logic and circuit implementations without affecting the scope of the claims described herein. In implementations, the multiplexor circuit 2200 can include a pair of current to voltage converters to generate the misalignment detector output or alignment signal.

Figure 3:
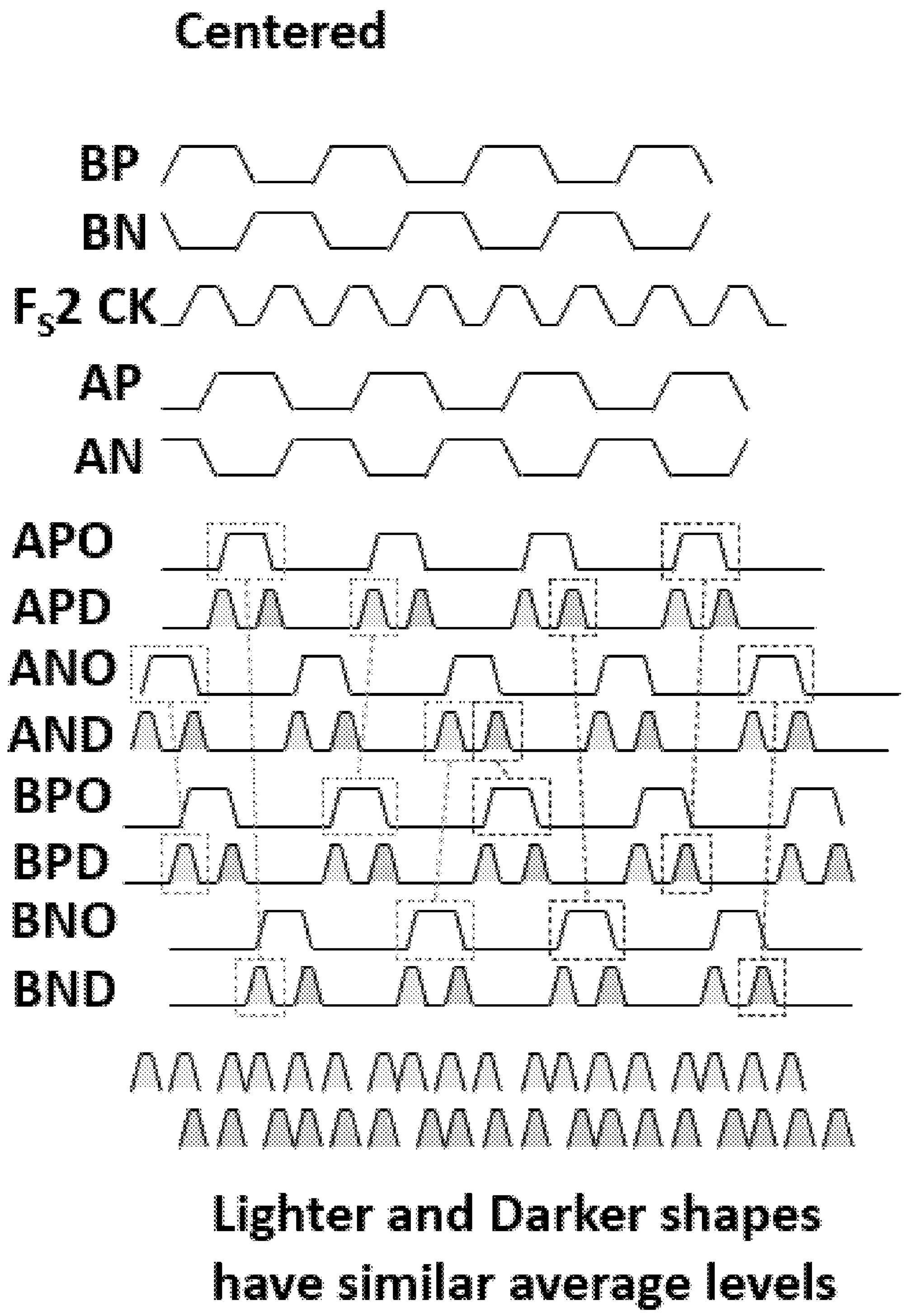
FIG. 3 is a diagram of $F_S/2$ frequency clock in alignment with sub-DAC replica data streams or $F_S/4$ frequency clocks in accordance with embodiments of this disclosure.
Figure 4:
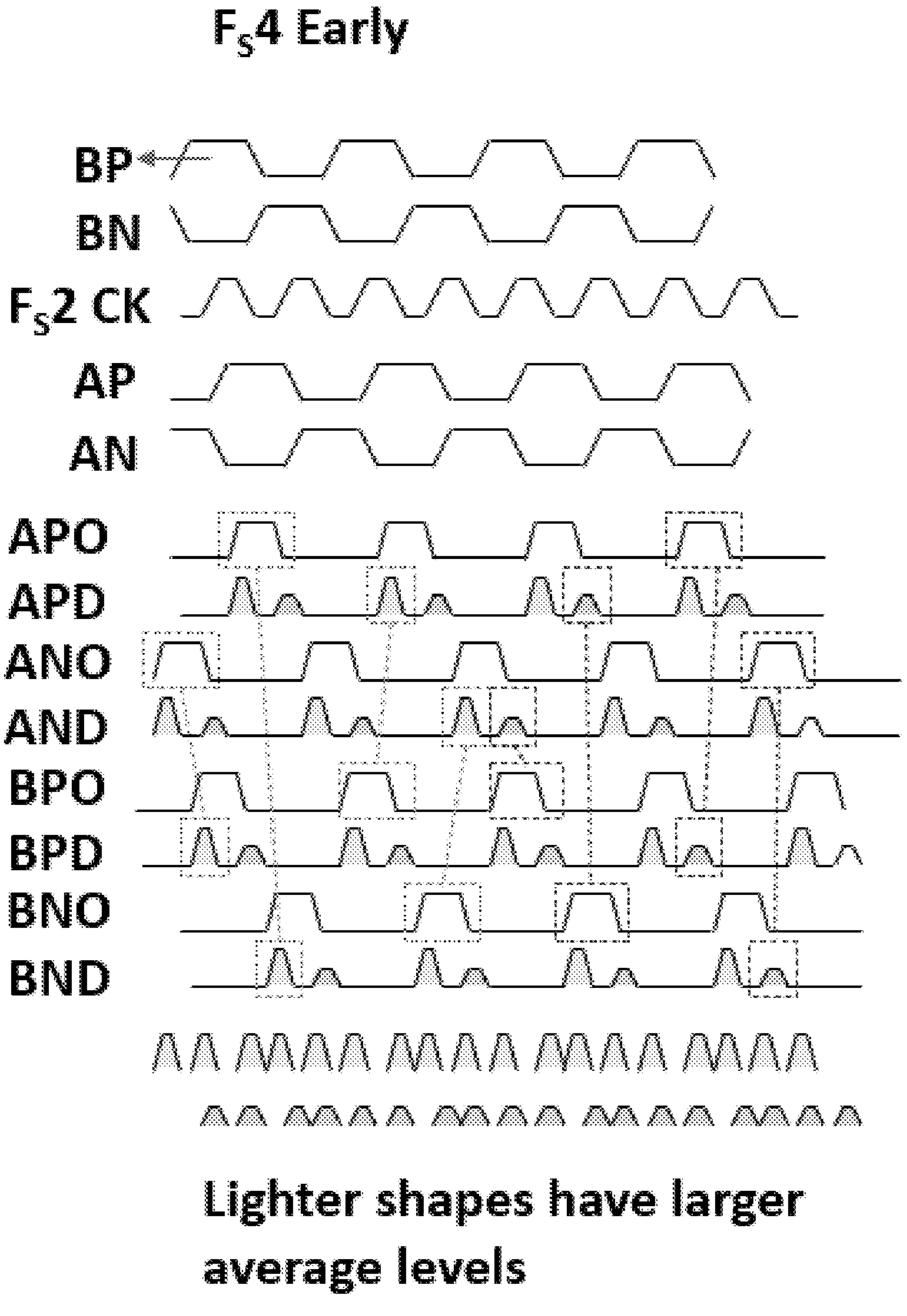
FIG. 4 is a diagram of an early $F_S/4$ frequency clock with respect to a $F_S/2$ frequency clock in accordance with embodiments of this disclosure.
Figure 5:
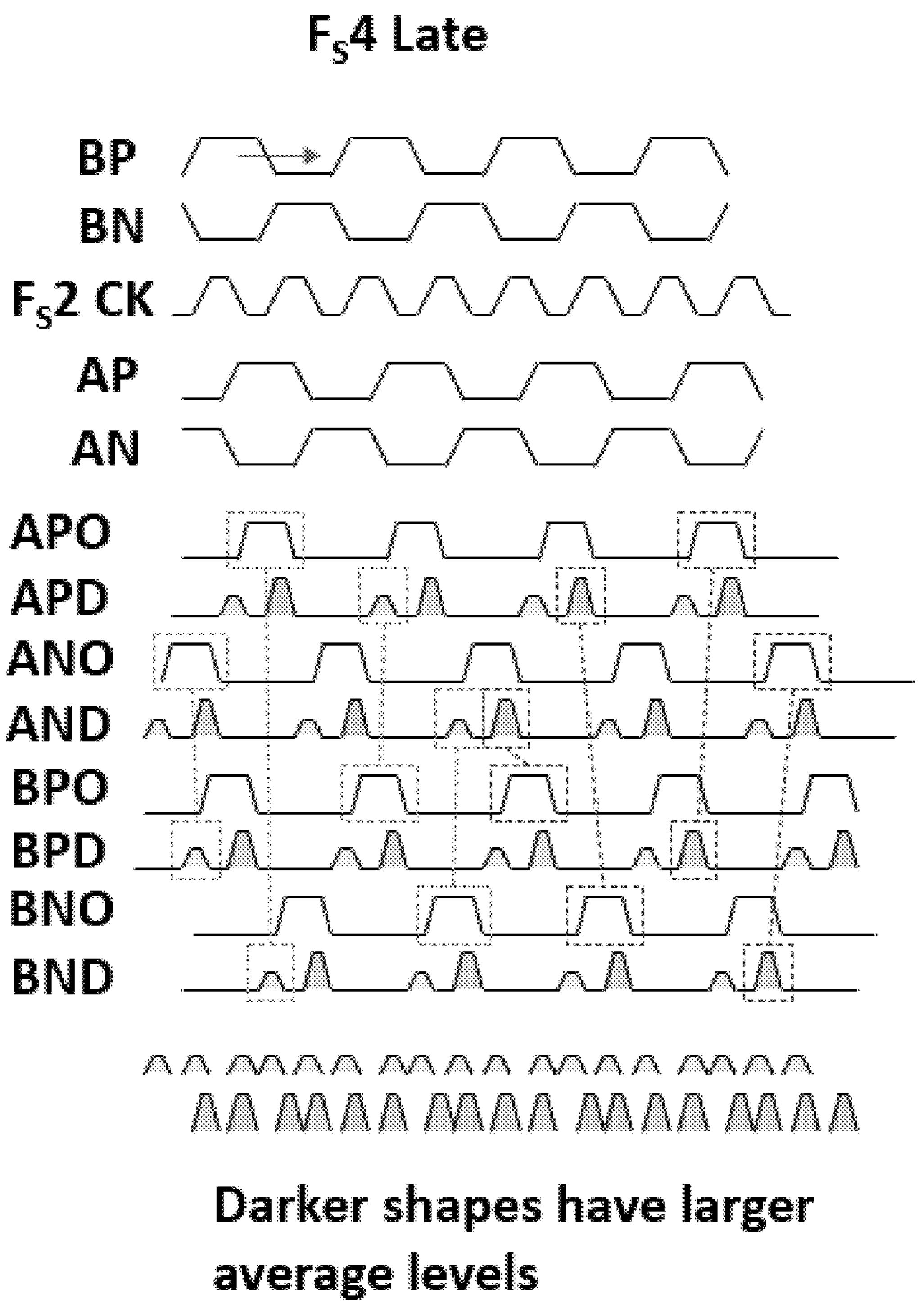
FIG. 5 is a diagram of a late $F_S/4$ frequency clock with respect to a $F_S/2$ frequency clock in accordance with embodiments of this disclosure.

FIG. 3 is a diagram of $F_S/2$ frequency clock in alignment with sub-DAC replica data streams or $F_S/4$ frequency clocks in accordance with embodiments of this disclosure, FIG. 4 is a diagram of an early $F_S/4$ frequency clock with respect to a $F_S/2$ frequency clock in accordance with embodiments of this disclosure, and FIG. 5 is a diagram of a late $F_S/4$ frequency clock with respect to a $F_S/2$ frequency clock in accordance with embodiments of this disclosure. Referring to FIGS. 1-5, the misalignment detector 2000 uses the outputs of the differential pair ports 2110, 2120, 2130, and 2140 of the replica interleaver 2100 to generate select and output signals, e.g., AND, APD, BND, BPD, ANO, APO, BNO, and BPO, at the select ports 2112, 2122, 2132, and 2142, and at the output ports 2114, 2124, 2134, and 2144, respectively. The misalignment detector 2000 and/or the multiplexor circuit 2200 can perform combining and summation operations on the select and output signals to generate the misalignment detector output or the alignment signal. In implementations, the select signals can have two lobes, e.g., shown as light grey and dark grey in FIGS. 3-5. The misalignment detector 2000 and/or the multiplexor circuit 2200 can capture all the early lobes (light grey) and sum them. The misalignment detector 2000 and/or the multiplexor circuit 2200 can capture all the late lobes (dark grey) and sum them. The early and late lobes can be separated by multiplying each select signal with the appropriate output signal and directed down an early or late path, as appropriate. The comparator can compare the sum of all the early lobes (light grey) to the sum of the late lobes (dark grey) to determine which of the average DC level of the early or late paths is higher. In implementations, the comparator can use a programmable threshold to determine if the $F_S/4$ clocks lead or lag the $F_S/2$ clock.

When the interleaver clock and sub-DAC data inputs are balanced exactly, each select signal matches in timing to a corresponding output signal on the other side of the interleaver. That is, two lobes of the select signal should be the same size in amplitude. This is shown in FIG. 3. If there is a misalignment, 4 of the sets of select/output signals will become smaller, and 4 of the sets of select/output signals will become larger. In one example, if the sub-DAC data input or $F_S/4$ frequency clock is early, then the early lobes (light grey) will be larger in amplitude than the late lobes (dark grey). This is shown in FIG. 4. In another example, if the sub-DAC data input or $F_S/4$ frequency clock is late, then the late lobes (dark grey) will be larger in amplitude than the early lobes (light grey). This is shown in FIG. 5. By taking the sum of each of the 4 sets together and comparing them to each other, the presence, direction, and magnitude of the clock/data misalignment can be detected. The controller 1600 can then adjust the $F_S/4$ frequency clocks to align or maintain the $F_S/2$ frequency clock centered around the peaks and troughs of the sub-DAC replica data. That is, the controller 1600 can then adjust the $F_S/4$ frequency clocks to align or maintain with the $F_S/2$ frequency clock.

Figure 6:
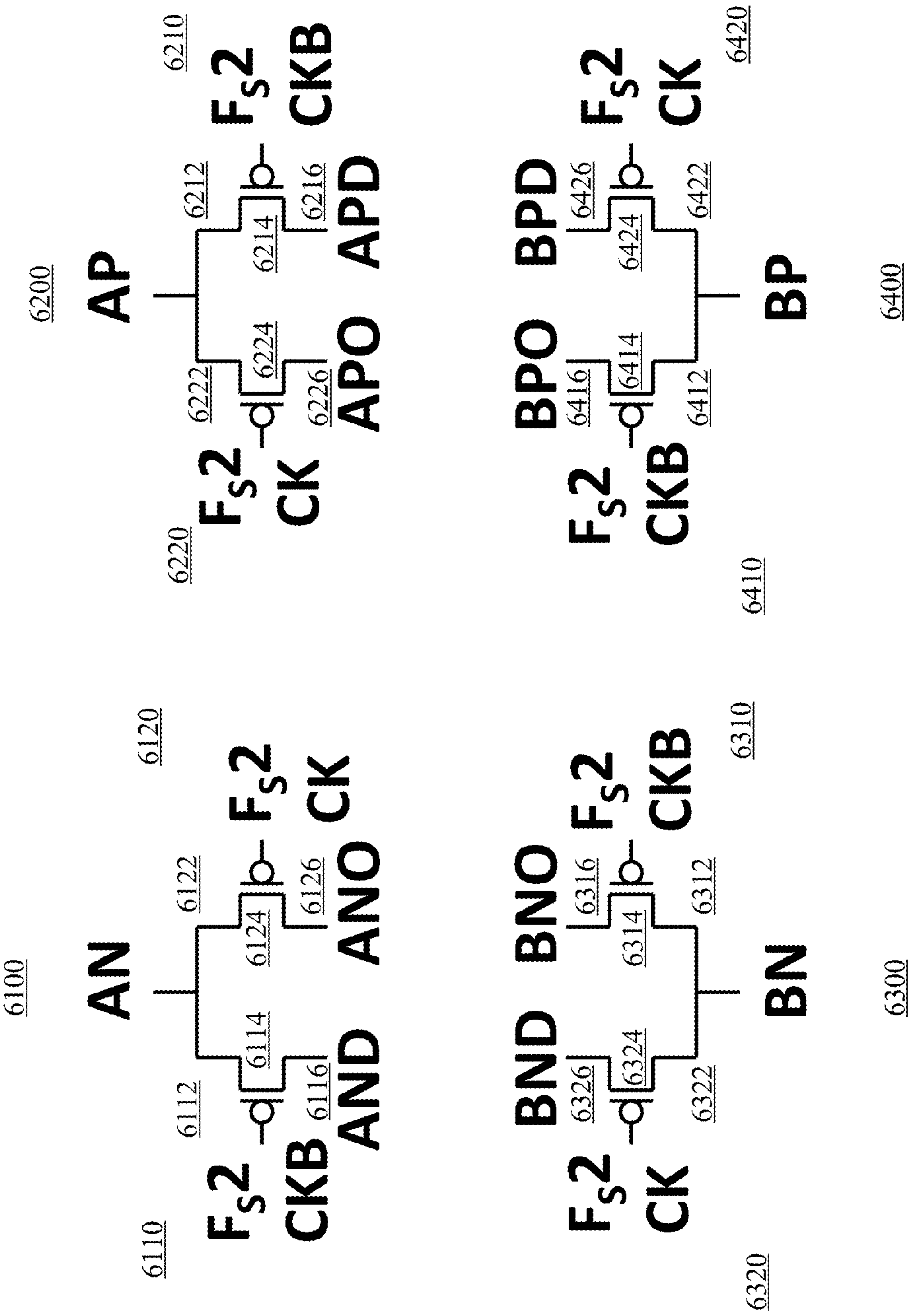
FIG. 6 is a block diagram of an interleaver in accordance with embodiments of this disclosure.

FIG. 6 is a block diagram of an interleaver 6000 in accordance with embodiments of this disclosure. The interleaver 6000 can be the interleaver 1400 of FIG. 1. The interleaver 6000 can function as described herein. The interleaver 6000 can include 2 or a pair of differential pair circuits, a pair of differential pair circuits 6100 and 6200 for a sub-DAC 1 1100 and a pair of differential pair circuits 6300 and 6400 for a sub-DAC 2 1110. In implementations, the pair of differential pair circuits 6100 and 6200 for the sub-DAC 1 1100 are in a diametrically opposed position with respect to the pair of differential pair circuits 6300 and 6400 for the sub-DAC 2 1110 to form a symmetric configuration which minimizes wire lengths of the set of transmission wires, i.e., the set of transmission wires 1800. Although p-channel metal-oxide semiconductor (PMOS) transistors are shown in FIG. 6, a variety of technologies can be used to implement the switching function, including but not limited to, n-channel metal-oxide semiconductor (NMOS) transistors, complementary metal-oxide-semiconductor (CMOS) transistors, negative-positive-negative (NPN) transistors, and positive-negative-positive (PNP) transistors.

The differential pair circuit 6100 can include a pair of transistors 6110 and 6120, each transistor 6110 and 6120 having a drain 6112 and 6122, respectively, a gate 6114 and 6124, respectively, and a source 6116 and 6126, respectively. The drains 6112 and 6122 are connected together and are connected to a single ended polarity of the sub-DAC 1 differential output. The gate 6114 is connected to an inverted interleaver clock and the gate 6124 is connected to the interleaver clock. The select and output signals for the single ended polarity are present at the sources 6116 and 6126, respectively.

The differential pair circuit 6200 can include a pair of transistors 6210 and 6220, each transistor 6210 and 6220 having a drain 6212 and 6222, respectively, a gate 6214 and 6224, respectively, and a source 6216 and 6226, respectively. The drains 6212 and 6222 are connected together and are connected to a remaining single ended polarity of the sub-DAC 1 differential output. The gate 6214 is connected to an inverted interleaver clock and the gate 6224 is connected to the interleaver clock. The select and output signals for the remaining single ended polarity are present at the sources 6216 and 6226, respectively.

The differential pair circuit 6300 can include a pair of transistors 6310 and 6320, each transistor 6310 and 6320 having a drain 6312 and 6322, respectively, a gate 6314 and 6324, respectively, and a source 6316 and 6326, respectively. The drains 6312 and 6322 are connected together and are connected to a single ended polarity of the sub-DAC 2 differential output. The gate 6314 is connected to an inverted interleaver clock and the gate 6324 is connected to the interleaver clock. The select and output signals for the single ended polarity are present at the sources 6316 and 6326, respectively.

The differential pair circuit 6400 can include a pair of transistors 6410 and 6420, each transistor 6410 and 6420 having a drain 6412 and 6422, respectively, a gate 6414 and 6424, respectively, and a source 6416 and 6426, respectively. The drains 6412 and 6422 are connected together and are connected to a remaining single ended polarity of the sub-DAC 2 differential output. The gate 6414 is connected to an inverted interleaver clock and the gate 6424 is connected to the interleaver clock. The select and output signals for the remaining single ended polarity are present at the sources 6416 and 6426, respectively.

The set of transmission wires 1800 of FIG. 1 are configured, for example, to combine the output signals (i.e., ANO, APO, BNO, and BPO) of the pair of differential pair circuits 6100 and 6200 for the sub-DAC 1 1100 and the pair of differential pair circuits 6300 and 6400 for the sub-DAC 2 1110, respectively, to form an output signal. The transmission wires 1750 are configured, for example, to output the output signal. In implementations, the transmission wires 1750 are a pair of transmission wires as described herein.

The transmission wires or lines ("transmission wires") 1750 are implemented with a defined degree of crossover to reduce the output clock feedthrough, while the data path remains unchanged or is minimally unchanged. The crossover refers to the transmission wires 1750 crossing over each other to increase the coupling between the transmission wires 1750. This helps to increase the coupling more at the higher frequencies, and not as much at the lower frequencies. The crossover can adjust the frequency dependent even/odd mode and/or mixed coupling at or in the transmission wires 1750. That is, the mixed mode coupling can be adjusted. The crossover can suppress common mode coupling. By adjusting the distance between the transmission wires 1750 and increasing the crossover, the $F_S/2$ even-mode coupling can be increased while maintaining odd mode coupling for output signal bandwidth. This allows for $F_S/2$ reduction without impacting the data path.

The crossover takes advantage of the fact that clock feedthrough is differential, and the transmission wires 1750 contain opposite phases of the $F_S/2$ signal. This implies that if the transmission wires 1750 were strongly coupled (either or both capacitively or inductively), then the differential clock signal will be reduced. Each output of each transmission wire 1750 sees a combination of the inputs, and since they are opposite in phase of each other they will cancel out. Noting that the DAC output signal is also a differential signal, the transmission wires 1750 are strongly cross-coupled at the $F_S/2$ frequency to reduce the clock feed-through and weakly cross-coupled at the DAC output signal, which is at a lower frequency than the $F_S/2$ frequency. That is, the transmission wires 1750 act as a filter due to the crossover.

Figure 7:
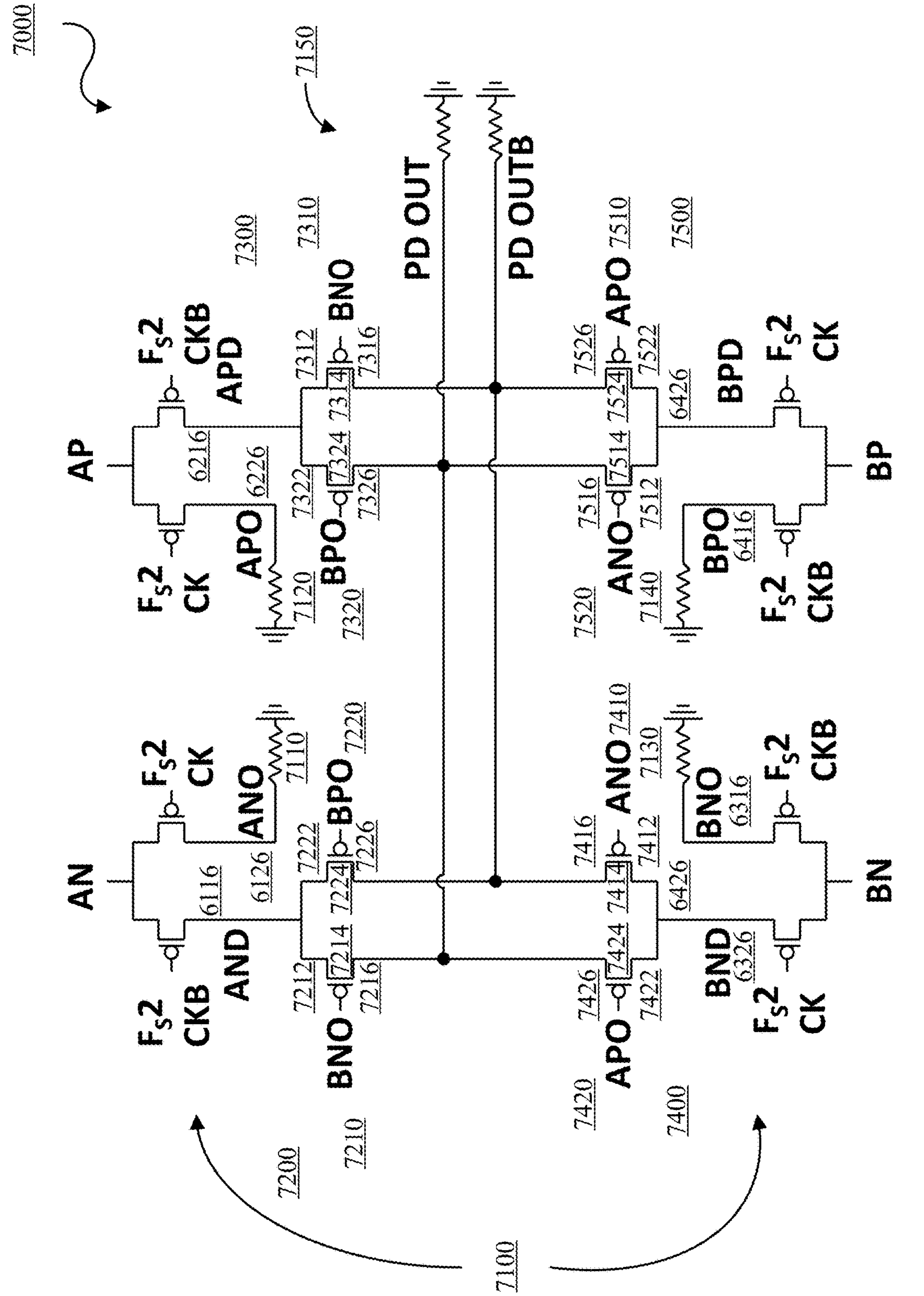
FIG. 7 is a block diagram of a misalignment detector circuit in accordance with embodiments of this disclosure.

FIG. 7 is a block diagram of a misalignment detector 7000 in accordance with embodiments of this disclosure. The misalignment detector 7000 includes a replica interleaver 7100 connected to a multiplexor-type current mode circuit 7150. The misalignment detector 7000 can function as described herein. Although p-channel metal-oxide semiconductor (PMOS) transistors are shown in FIG. 7, a variety of technologies can be used to implement the switching function, including but not limited to, n-channel metal-oxide semiconductor (NMOS) transistors, complementary metal-oxide-semiconductor (CMOS) transistors, negative-positive-negative (NPN) transistors, and positive-negative-positive (PNP) transistors.

The replica interleaver 7100 is as described for interleaver 6000 except as described below. Item numbers are reused for convenience. In the replica interleaver 7100, the source 6126 is connected to a resistor 7110, the source 6226 is connected to a resistor 7120, the source 6316 is connected to a resistor 7130, and the source 6416 is connected to a resistor 7140. The resistors 7110, 7120, 7130, and 7140 perform as current to voltage converters as described herein.

The multiplexor-type current mode circuit 7150 can include four (4) pairs of differential pair circuits 7200, 7300, 7400, and 7500, one for each of the pair of differential pair circuits 6100, 6200, 6300 and 6400, respectively.

The differential pair circuit 7200 can include a pair of transistors 7210 and 7220, each transistor 7210 and 7220 having a drain 7212 and 7222, respectively, a gate 7214 and 7224, respectively, and a source 7216 and 7226, respectively. The drains 7212 and 7222 are connected together and are connected to the source 6116, which provides a select signal with one polarity associated with the sub-DAC 1. The gate 7214 is connected to an output signal associated with a sub-DAC 2, the output signal having the same polarity as the select signal. The gate 7224 is connected to an output signal associated with a sub-DAC 2, the output signal having an opposite polarity as the select signal.

The differential pair circuit 7300 can include a pair of transistors 7310 and 7320, each transistor 7310 and 7320 having a drain 7312 and 7322, respectively, a gate 7314 and 7324, respectively, and a source 7316 and 7326, respectively. The drains 7312 and 7322 are connected together and are connected to the source 6216, which provides a select signal with a remaining polarity associated with the sub-DAC 1. The gate 7314 is connected to an output signal associated with a sub-DAC 2, the output signal having the opposite polarity as the select signal. The gate 7324 is connected to an output signal associated with a sub-DAC 2, the output signal having a same polarity as the select signal.

The differential pair circuit 7400 can include a pair of transistors 7410 and 7420, each transistor 7410 and 7420 having a drain 7412 and 7422, respectively, a gate 7414 and 7424, respectively, and a source 7416 and 7426, respectively. The drains 7412 and 7422 are connected together and are connected to the source 6326, which provides a select signal with one polarity associated with the sub-DAC 2. The gate 7414 is connected to an output signal associated with a sub-DAC 1, the output signal having the same polarity as the select signal. The gate 7424 is connected to an output signal associated with a sub-DAC 1, the output signal having an opposite polarity as the select signal.

The differential pair circuit 7500 can include a pair of transistors 7510 and 7520, each transistor 7510 and 7520 having a drain 7512 and 7522, respectively, a gate 7514 and 7524, respectively, and a source 7516 and 7526, respectively. The drains 7512 and 7522 are connected together and are connected to the source 6426, which provides a select signal with a remaining polarity associated with the sub-DAC 2. The gate 7514 is connected to an output signal associated with a sub-DAC 1, the output signal having the opposite polarity as the select signal. The gate 7524 is connected to an output signal associated with a sub-DAC 1, the output signal having a same polarity as the select signal.

The sources 7216, 7426, 7326, and 7516 are connected together to generate the phase detector output of the misalignment detector 7000, and the sources 7226, 7416, 7316, and 7526 are connected together to generate the inverted phase detector output of the misalignment detector 7000.

Referencing now also to FIG. 1, the misalignment detector 1510 can be co-located with the interleaver 1400. This ensures that the input clock phases going to the misalignment detector 1510 match in both amplitude and phase with the clock phases going to the interleaver 1400. This also reduces the lengths of the clock wires 1700 and reduces the area required for the misalignment detector 1510 and the interleaver 1400. The co-location can also prevent the effect of signal reflections at the input of the misalignment detector 1510 for both the interleaver clock and replica data paths, which is important in maintaining signal integrity, signal level, and matching its corresponding clock phase. The co-location can improve delay matching, reduce effect of series peaking that would reduce clock levels, enables use of $F_S/2$ clock level as initial driving stage (rather than using replica data slices to generate clocks), and improves signal level. The end result is a response curve which tracks interleaver peak signal-to-noise-to distortion ratio (SNDR) and has minimal gain droop across process-voltage-temperature (PVT).

Figure 8:
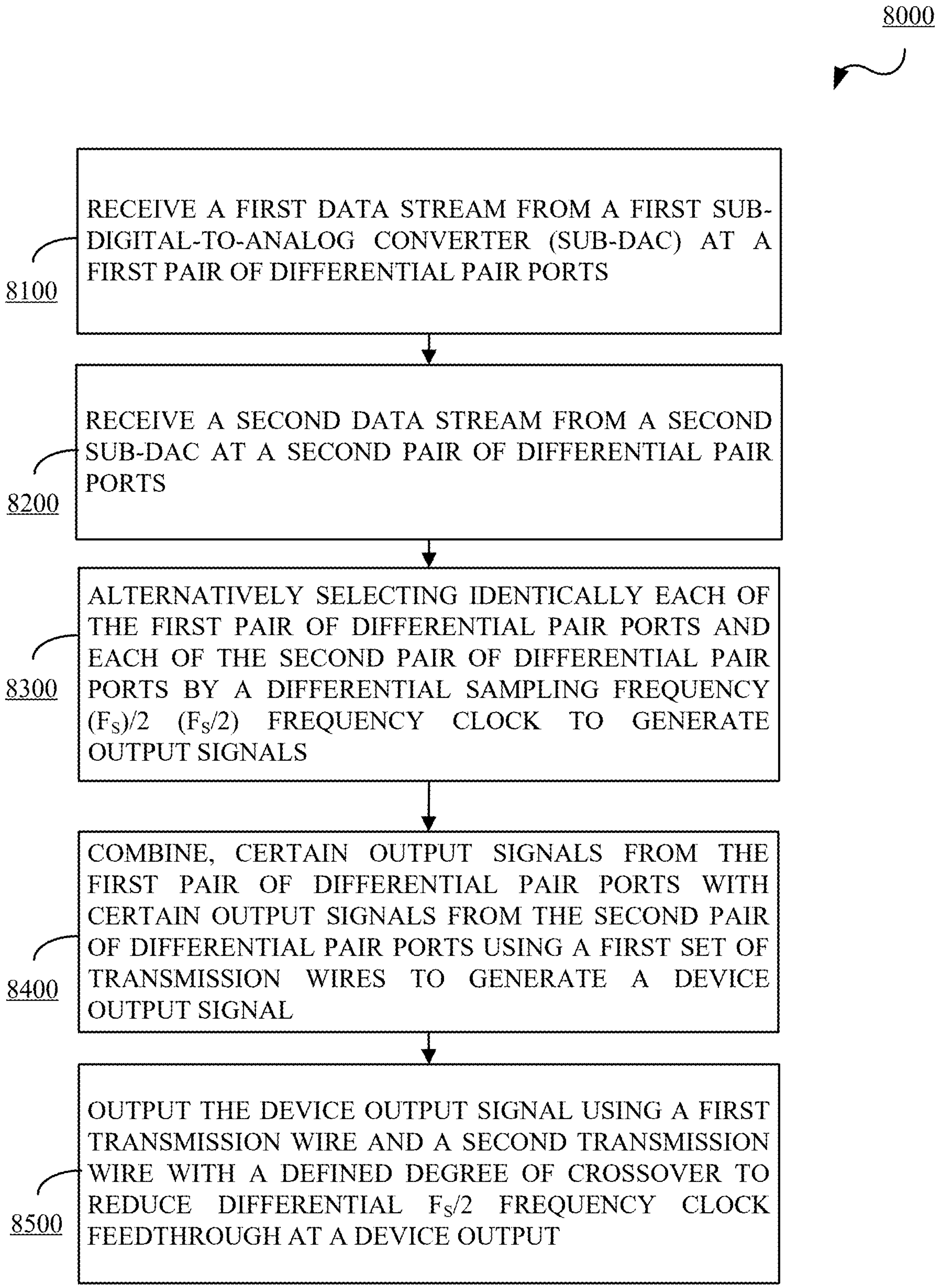
FIG. 8 is a flowchart of an example technique for digital to analog conversion in accordance with embodiments of this disclosure.

FIG. 8 is a flowchart of an example of a method 8000 for use with a DAC in accordance with embodiments of this disclosure. The method 8000 includes: receiving 8100 a first data stream from a first sub-digital-to-analog converter (sub-DAC) at a first pair of differential pair ports, receiving 8200 a second data stream from a second sub-DAC at a second pair of differential pair ports; alternately selecting and/or alternately selecting identically 8300 each of the first pair of differential pair ports and each of the second pair of differential pair ports by a differential sampling frequency $(F_S)/2$ $(F_S/2)$ frequency clock to generate output signals; combining 8400, certain output signals from the first pair of differential pair ports with certain output signals from the second pair of differential pair ports using a set of transmission wires to generate a device output signal; and outputting 8500 the device output signal using a first transmission wire and a second transmission wire with a defined degree of crossover to reduce differential $F_S/2$ frequency clock feed-through at a device output. The method 8000 can be implemented by the devices and components described herein and in FIGS. 1-7, as appropriate and applicable.

The method 8000 includes receiving 8100 a first data stream from a first sub-digital-to-analog converter (sub-DAC) at a first pair of differential pair ports and receiving 8200 a second data stream from a second sub-DAC at a second pair of differential pair ports. A DAC can include an interleaver with a first pair of differential pair ports and a second pair of differential pair ports as described herein.

The method 8000 includes alternately selecting and/or alternately selecting identically 8300 each of the first pair of differential pair ports and each of the second pair of differential pair ports by a differential sampling frequency $(F_S)/2$ $(F_S/2)$ frequency clock to generate output signals. The first data stream and the second data stream are alternately selected and/or alternately selected identically via the $F_S/2$ clock.

The method 8000 includes combining 8400, certain output signals from the first pair of differential pair ports with certain output signals from the second pair of differential pair ports using a set of transmission wires to generate a device output signal. The first pair of differential pair ports and the second pair of differential pair ports are in a collocated configuration and interconnected as described herein with the set of transmission wires.

The method 8000 includes outputting 8500 the device output signal using a first transmission wire and a second transmission wire with a defined degree of crossover to reduce differential $F_S/2$ frequency clock feedthrough at a device output. The first transmission wire and the second transmission wire are output wires which are shielded and/or isolated from the differential sampling frequency $F_S/2$ frequency clock.

In implementations, the method 8000 can include a method for misalignment detection. The method can include receiving a first replica data stream from the first sub-DAC at a first replica pair of differential pair ports of a replica interleaver and receiving a second replica data stream from the second sub-DAC at a second replica pair of differential pair ports of the replica interleaver. The first replica data stream is based on a first sub-DAC differential $F_S/4$ frequency clock and the second replica data stream is based on a second sub-DAC differential $F_S/4$ frequency clock. Each of the first replica pair of differential pair ports and each of the second replica pair of differential pair ports are substantially identically sampled and/or alternately selected identically and/or alternately selected with or by a differential sampling frequency $(F_S)/2$ $(F_S/2)$ frequency clock to generate replica output signals and replica select signals. The certain replica output signals and certain replica select signals from the first replica pair of differential pair ports and the second replica pair of differential pair ports are combined at a multiplexor circuit to generate an alignment signal. The alignment signal is used to align the first sub-DAC $F_S/4$ frequency clock and the second sub-DAC differential $F_S/4$ frequency clock with the differential $F_S/2$ frequency clock.

Although some embodiments herein refer to methods, it will be appreciated by one skilled in the art that they may also be embodied as a system or computer program product. Accordingly, aspects of the present invention may take the form of an entirely hardware embodiment, or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A device, comprising:

an interleaver with a first pair of differential pair ports configured to receive a first data stream from a first sub-digital-to-analog converter (sub-DAC) and a second pair of differential pair ports configured to receive a second data stream from a second sub-DAC, wherein each of the first pair of differential pair ports and each of the second pair of differential pair ports are alternately selected by a differential sampling frequency $(F_S)/2$ $(F_S/2)$ frequency clock to generate output signals;

a set of transmission wires configured to combine certain output signals from the first pair of differential pair ports with certain output signals from the second pair of differential pair ports to generate a device output signal; and a pair of transmission wires configured to output the device output signal, wherein a first transmission wire and a second transmission wire of the pair of transmission wires have a layout with a defined degree of crossover to reduce differential $F_S/2$ frequency clock feedthrough on the device output signal.

2. The device of claim 1, further comprises a misalignment detector with a replica interleaver and a multiplexor circuit;

the replica interleaver including a first replica pair of differential pair ports configured to receive a first replica data stream from the first sub-DAC and a second replica pair of differential pair ports configured to receive a second replica data stream from the second sub-DAC, wherein each of the first replica pair of differential pair ports and each of the second pair of differential pair ports are alternately selected by the differential $F_S/2$ frequency clock to generate replica output signals and replica select signals, and wherein the first replica data stream is based on a first sub-DAC differential $F_S/4$ frequency clock and the second replica data stream is based on a second sub-DAC differential $F_S/4$ frequency clock; and the multiplexor circuit configured to combine certain of the replica output signals and certain of the replica select signals from the first replica pair of differential pair ports and the second replica pair of differential pair ports to generate an alignment signal, wherein the alignment signal is used to align the first sub-DAC $F_S/4$ frequency clock and the second sub-DAC differential $F_S/4$ frequency clock with the differential $F_S/2$ frequency clock.

3. The device of claim 2, wherein each replica select signal has a first lobe and a second lobe, and the multiplexor circuit is configured to sum amplitudes of the first lobes and to sum amplitudes of the second lobes to generate the alignment signal.

4. The device of claim 2, wherein each replica select signal has an early lobe and a late lobe and the multiplexor circuit is configured to sum amplitudes of the early lobes and to sum amplitudes of the late lobes, and wherein the multiplexor circuit further comprises a comparator configured to compare the sum of the early lobes to the sum of the late lobes to determine the alignment signal.

5. The device of claim 4, wherein a comparison indicates a presence, a direction, and a magnitude of the alignment signal.

6. The device of claim 2, wherein replica outputs of the first replica pair of differential pair ports and the second pair of differential pair ports are connected to resistors configured to convert some of the replica output signals from a current to a voltage.

7. The device of claim 1, wherein the defined degree of crossover adjusts frequency dependent even/odd mode coupling at or in the pair of transmission wires.

8. The device of claim 1, wherein the defined degree of crossover adjusts frequency dependent mixed mode coupling at or in the pair of transmission wires.

9. The device of claim 1, wherein the defined degree of crossover is adjusted by adjusting a distance between the pair of transmission wires.

10. A method-, comprising:

receiving, at a first pair of differential pair ports of an interleaver, a first data stream from a first sub-digital-to-analog converter (sub-DAC);

receiving, at a second pair of differential pair ports of the interleaver, a second data stream from a second sub-DAC;

alternately selecting each of the first pair of differential pair ports and each of the second pair of differential pair ports by a differential sampling frequency $(F_S)/2$ $(F_S/2)$ frequency clock to generate output signals;

combining, using a set of transmission wires, certain output signals from the first pair of differential pair ports with certain output signals from the second pair of differential pair ports to generate a device output signal; and outputting, using a first transmission wire and a second transmission wire having a layout with a defined degree of crossover to reduce differential Fs/2 frequency clock feedthrough at a device output, the device output signal.

11. The method of claim 10, further comprises receiving, at a first replica pair of differential pair ports of a replica interleaver, a first replica data stream from the first sub-DAC, wherein the first replica data stream is based on a first sub-DAC differential $F_S/4$ frequency clock;

receiving, at a second replica pair of differential pair ports of the replica interleaver, a second replica data stream from the second sub-DAC, wherein the second replica data stream is based on a second sub-DAC differential $F_S/4$ frequency clock;

alternately selecting each of the first replica pair of differential pair ports and each of the second replica pair of differential pair ports by the differential sampling $F_S/2$ frequency clock to generate replica output signals and replica select signals; and combining, at a multiplexor circuit, certain of the replica output signals and certain of the replica select signals from the first replica pair of differential pair ports and the second replica pair of differential pair ports to generate an alignment signal, wherein the alignment signal is used to align the first sub-DAC $F_S/4$ frequency clock and the second sub-DAC differential $F_S/4$ frequency clock with the differential Fs/2 frequency clock.

12. The method of claim 11, wherein each replica select signal has a first lobe and a second lobe, and the method further comprises summing amplitudes of the first lobes and summing amplitudes of the second lobes to generate the alignment signal.

13. The method of claim 11, wherein each replica select signal has an early lobe and a late lobe and the method further comprises summing amplitudes of the early lobes and summing amplitudes of the late lobes; and comparing a sum of the early lobes to a sum of the late lobes to determine the alignment signal.

14. The method of claim 13, wherein a comparison indicates a presence, a direction, and a magnitude the alignment signal.

15. The method of claim 11, further comprises converting some of the replica output signals of the first replica pair of differential pair ports and the second pair of differential pair ports from a current to a voltage using resistors.

16. The method of claim 10, wherein the defined degree of crossover adjusts frequency dependent even/odd mode coupling at or in the pair of transmission wires.

17. The method of claim 10, wherein the defined degree of crossover adjusts frequency dependent mixed mode coupling at or in the pair of transmission wires.

18. The method of claim 10, further comprises adjusting the defined degree of crossover by adjusting a distance between the pair of transmission wires.

19. A device, comprising:

an interleaver configured to receive a first data stream from a first sub-digital-to-analog converter (sub-DAC) and a second data stream from a second sub-DAC, and operate using a first clock, wherein each of the first sub-DAC and the second sub-DAC are configured to use a second clock;

a replica interleaver configured to receive a first replica data stream from the first sub-DAC and a second replica data stream from the second sub-DAC, and operate at the second clock to generate replica output signals and replica select signals;

a multiplexor circuit configured to combine certain of the replica output signals and certain of the replica select signals to generate an alignment signal, wherein the alignment signal is used to align the second clock with the first clock, wherein each replica select signal has an early lobe and a late lobe and the multiplexor circuit is further configured to sum amplitudes of the early lobes and to sum amplitudes of the late lobes; and a comparator configured to compare the sum of the early lobes to the sum of the late lobes to determine the alignment signal.

20. The device of claim 19, wherein a comparison indicates a presence, a direction, and a magnitude the alignment signal.

* * * * *